(12) United States Patent
Sato et al.

(10) Patent No.: US 6,317,198 B1
(45) Date of Patent: Nov. 13, 2001

(54) METHOD OF EXAMINING AN EXPOSURE TOOL

(75) Inventors: Kazuya Sato; Satoshi Tanaka, both of Kawasaki; Tadahito Fujisawa, Tokyo; Soichi Inoue, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/345,758

(22) Filed: Jul. 1, 1999

(30) Foreign Application Priority Data

Jul. 2, 1998 (JP) .................................. 10-187624

(51) Int. Cl.$^7$ ........................... G03B 27/32; G03B 27/42; G03F 9/00
(52) U.S. Cl. .................................... 355/77; 355/53; 430/5
(58) Field of Search ................................. 355/53, 77, 67, 355/71; 430/5, 269, 322, 324

(56) References Cited

U.S. PATENT DOCUMENTS

| | | | |
|---|---|---|---|
| 5,348,837 | * 9/1994 | Fukuda et al. | 430/269 |
| 5,703,675 | * 12/1997 | Hirukawa et al. | 355/53 |
| 5,710,620 | * 1/1998 | Taniguchi | 355/53 |
| 5,888,677 | * 3/1999 | Nakae | 430/5 |
| 5,973,771 | 10/1999 | Hibbs et al. | 356/121 |
| 5,989,756 | * 11/1999 | Nakae | 430/5 |
| 6,016,187 | * 1/2000 | Noguchi et al. | 355/53 |
| 6,048,651 | 4/2000 | Brunner et al. | 430/5 |

OTHER PUBLICATIONS

Schoot, et al., "The Mask Error Factor: Causes and Implications for Process Latitude," SPIE, vol. 3679, pp. 250–260, Mar. 17–19, 1999.*

Christopher Progler et al., "Potential causes of across field CD variation", Proceedings of SPIE, Optical Microlithography X, Session VI, vol. 3051, pp. 660–671, (1997).

Joe Kirk et al., Pinholes and pupil fills, Microlithography World, pp. 25–34, (1997).

Kazuya Sato et al., "Measurement of effective source shift using a grating–pinhole mask", Proceedings of SPIE, Optical Microlithography XII, Session II, (1999), Mar. 17–19, 1999.

* cited by examiner

*Primary Examiner*—Russell Adams
*Assistant Examiner*—Rodney Fuller
(74) *Attorney, Agent, or Firm*—Finnegan, Henderson, Farabow, Garrett & Dunner, L.L.P.

(57) ABSTRACT

In a method of examining the shape of the light source of an exposure tool, the shape of the pupil of its projection optical system, and the alignment of the shape of the light source with the shape of the pupil, the exposure tool comprising a light source, an illumination optical system for directing the light emitted from the light source to a reticle, and a projection optical system for transferring the reduced image on the reticle onto a wafer, the light emitted from the light source is projected on a reticle including a grating pattern where a transmitting area and a shading area are repeated in a finite number, the diffracted light of the first order or higher passed through the reticle is caused to illuminate the outer edge of the pupil of the projection optical system, and the pattern image on the reticle is projected on the wafer in the defocus state.

17 Claims, 10 Drawing Sheets

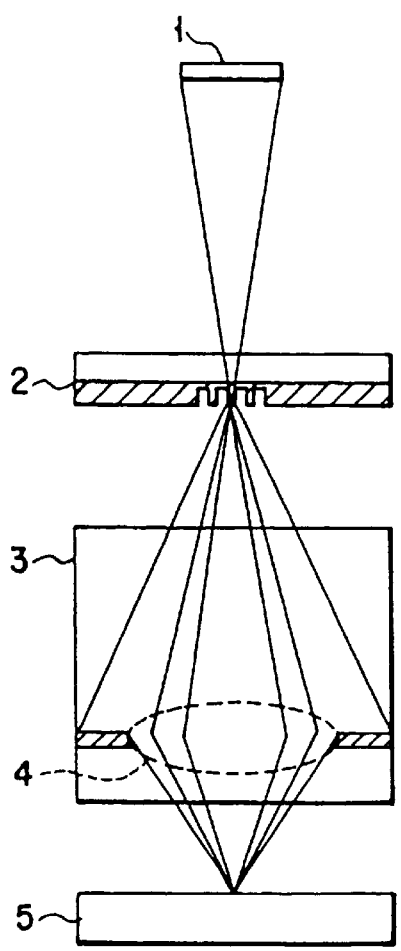
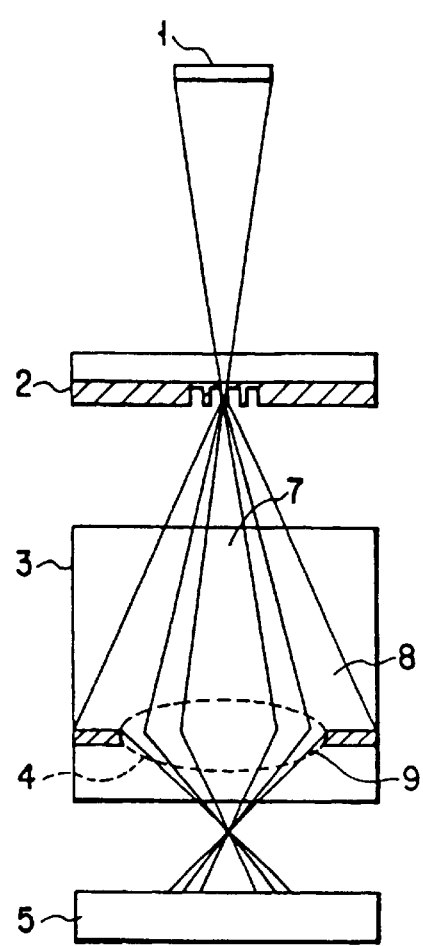
FIG. 3A  FIG. 3B
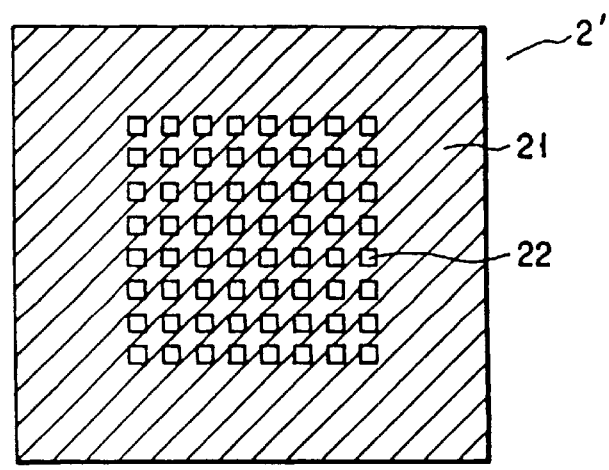
FIG. 4

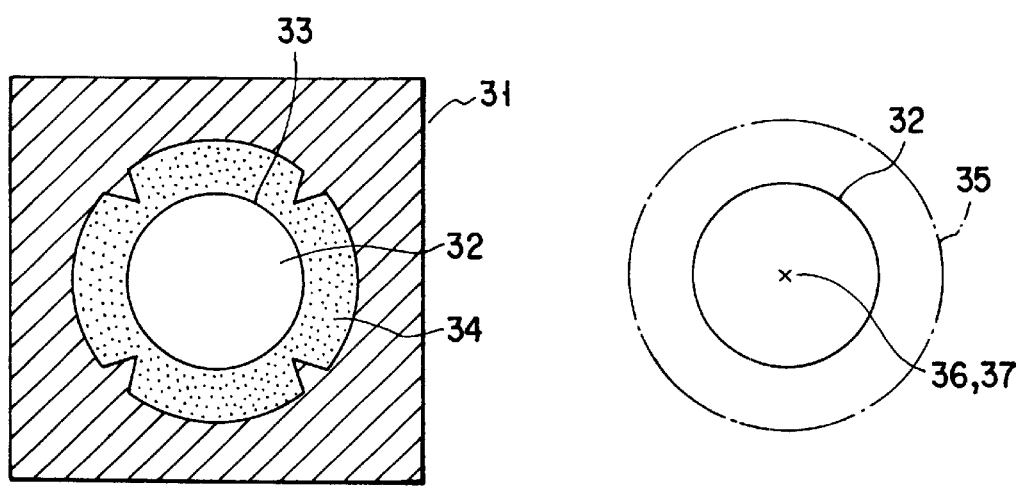
FIG. 5A
FIG. 5B
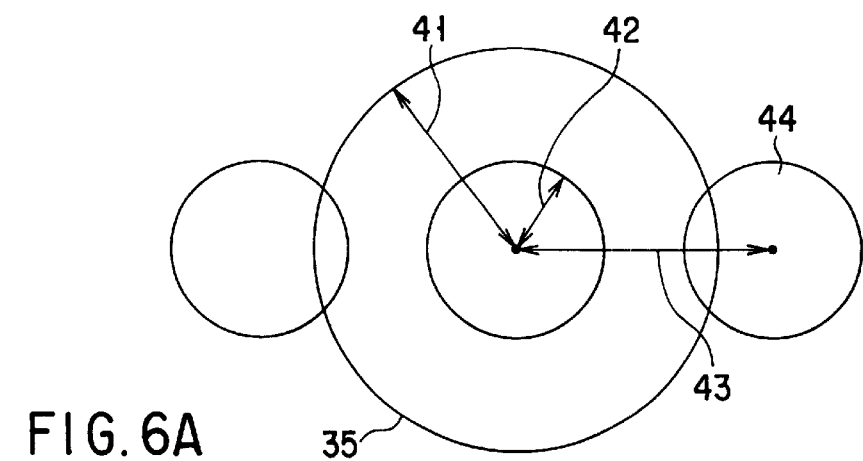
FIG. 6A
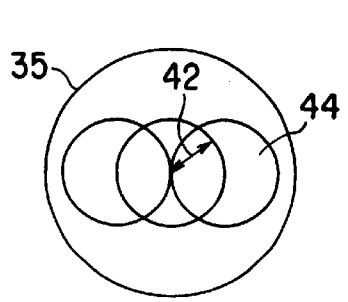
FIG. 6B
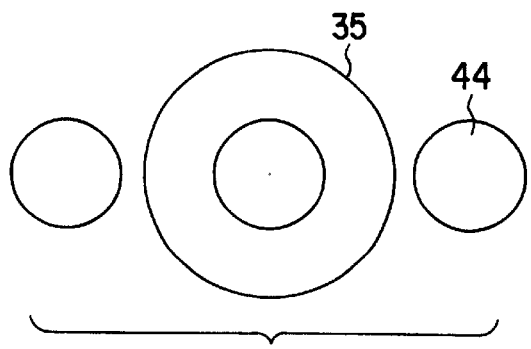
FIG. 6C

METHOD OF EXAMINING AN EXPOSURE TOOL

BACKGROUND OF THE INVENTION

This invention relates to a method of examining an exposure tool, and more particularly to a method of examining an exposure tool used to measure not only the shape of the light source and that of the pupil of the projection optical system but also the alignment of the axis of the illumination optical system with that of the projection optical system in the exposure tool.

The manufacture of semiconductor-device circuit patterns generally requires lithography. In a projection exposure tool used in lithography, the light emitted from the light source enters the illumination optical system, which illuminates the reticle at almost uniform illuminance. The light passed through the reticle goes through the projection optical system, exposes the photoresist, and forms the on-reticle circuit pattern on the photoresist.

As the area exposed simultaneously by an exposure tool increases, the formation of a pattern differs from place to place in the exposure area. Namely, the dimensions of the pattern vary in the die. One cause of the problem is variations in the shape and light intensity of coherence factor (σ) in the simultaneous exposure area. The coherence factor (σ) represents the effective size of the illumination optical system. In this case, the intensity at which light illuminates the reticle and the direction in which the light incidents the reticle differs place to place. Since σ is a parameter that controls the contrast of an image, variations in σ means variations in the exposure characteristic in the simultaneous exposure area.

The problem of a conventional exposure tool will be explained by reference to FIGS. 1A and 1B. As shown in FIG. 1A, a general exposure tool has a common axis optical system in which an illumination optical system 1, a reticle 2, a projection optical system 3, and a wafer 5 are arranged in a straight line. This arrangement is limited to the design stage. Actually, however, each lens may have deviated from a reference axis in a different direction. If the illumination optical system 1' and the projection optical system 3 do not have common axis, the diffracted light passed through the reticle 2 enters the projection optical system 3 obliquely as a whole. In this case, the image whose position shouldn't be changed even after the defocusing of the position of the wafer 5 to the position 5' as shown in FIG. 1A moves as a result of defocusing as shown in FIG. 1B.

The variation of σ and the light intensity in the simultaneous exposure area and the disagreement between the axis of the illumination optical system and that of the projection optical system combine to narrow the allowance for exposure and focal depth necessary for creating a correct pattern. This makes it difficult to form a very small circuit pattern by lithography, which leads to a decrease in the yield in manufacturing semiconductor devices. To avoid this, it is necessary to examine and adjust not only the σ of the exposure tool but also the deviation of the optical axis of the illumination optical system from that of the projection optical system or vice versa.

If the exposure tool were disassembled and a measuring unit, such as an interferometer or a camera, were provided, measurements could be made with high accuracy. This approach has a problem: the disassembling of the exposure tool would make the state of the tool different from that in the preceding operation. Another problem is to require a lot of time and labor. To overcome these problem, a simple examining method that can be carried out without disassembling the exposure tool is required.

A method of examining an exposure tool without disassembling it, which was carried out by Progler, et al., will be explained by reference to FIGS. 2A to 2C. First, two types of pattern are formed on the back of a reticle by a first step shown in FIG. 2A and a second step shown in FIG. 2B. These patterns are formed on the same reticle or separate reticles. The pattern of FIG. 2A is a pattern in which a transmitting area (an isolated pinhole 121) is isolated in a shading area. The pattern of FIG. 2B is a pattern in which a shading area (an isolated shading dot 122) is isolated in a transmitting area.

The larger the size of the isolated pinhole 121, the greater the diffraction angle of light 123 passing through the pinhole 121. Making use of this phenomenon, the size of the pinhole 121 is so adjusted that the diffracted light illuminates all the surface including the outer edge of the pupil 4 of the projection optical system. The size of the isolated shading dot 122 is made a little large to the extent that the diffraction becomes inconspicuous. First, the isolated pinhole 121 is exposed. The light diffracted at the isolated pinhole 121 illuminates the whole surface of the pupil 4 of the projection system lens. The light passed through the pupil 4 forms an exposure area 125. Next, the reticle 2 is so manipulated without moving the wafer that the isolated shading dot 122 is put in the position where the isolated hole was just before. Then, exposure is made. The pattern is such that the transmitting area is replaced with the shading area in the isolated pinhole 121 of FIG. 2A. In the image transferred to the wafer 5, too, the bright area is reversed into a dark area and the dark area is reversed into a bright area. Because the shading area is so great that it is influenced slightly by diffraction, an image 128 (an image representing the size σ of the light source) appears clearly on the wafer 5. At this time, the amount of exposure is minimized so that the photoresist on the patternless area may be developed on the reticle 2 to such a degree that the development is stopped in a thinner film state. After the double exposure, development is made to produce a photoresist pattern of the shape shown in FIG. 2C. This makes it possible to measure the shape 129 of the light source, the shape 130 of the pupil of the projection optical system, and the difference in position between the shape 129 of the light source and the shape 30 of the pupil.

Their method, however, has the following problems.

Firstly, in the first of the double exposure, diffracted light illuminating the whole pupil of the projection optical system is generated using a single pinhole. To cause this phenomenon, the size of the pinhole has to be made very small. For example when using KrF eximer laser exposure tool (NA=0.6, M=4, and σ=0.75), the diameter of the pinhole must be 4 μm or less to achieve the situation.

When an attempt is made to expose the pinhole of this size existing in the back of the reticle, it takes a very long time to obtain the desired pattern because the light passing through the pinhole and reaching the wafer spreads and becomes is very weak. Making the size of the pinhole larger increases the total dosage of light passing through the pinhole. This, however, decreases the light intensity at the edge of the pupil of the projection optical system, failing to achieve the object.

Secondly, to observe film reduction, it is necessary to recognize a slight difference in contrast. Therefore, judging the shape of an image representing the size of the pupil requires an image processing on a computer to enhance the contrast and observe the photoresist image.

Thirdly, there arises an error in alignment during double exposure. The measured value of the positional deviation includes the error.

Fourthly, since the decreased film state has to be produced in both the first exposure and the second exposure, the adjustment of the dosage of exposure is very delicate.

As described above, although the conventional examining method has solved the problem of measuring an exposure tool without disassembling it, it is hard to say the method is simple.

BRIEF SUMMARY OF THE INVENTION

The object of the present invention is to provide an exposure-tool examining method capable of examining an exposure tool easily and quickly without disassembling the tool.

A method of examining an exposure tool according to the present invention comprises the step of causing an illumination optical system to direct light emitted from a light source to a reticle on which a periodic pattern is formed, the pattern in which a transmitting area and a shading area are repeated in a finite number; the step of projecting the diffracted light of the first order or higher passed through the reticle onto the edge of the pupil of a projection optical system and forming a pattern image on a wafer in a defocus state; and the step of examining the shape of the light source, the shape of the pupil of the projection optical system, and the alignment of the shape of the light source with the shape of the pupil on the basis of the pattern image transferred onto the wafer.

The periodic pattern in the reticle includes a line & space pattern, a grading pattern where square patterns of transmitting area are arranged in a matrix in a shading area, a hole array pattern where isolated round patterns of transmitting area are arranged in a matrix in a shading area, a checkered pattern, and patterns formed by reversing the transmitting area and the shading area in each of these patterns.

The reticle preferably includes a periodic pattern where a transmitting area and a shading area are repeated in the pitch p expressed by the following expression:

$$M\lambda/\{(1+\sigma) \times NA\} < p < M\lambda/\{(1-\sigma) \times NA\}$$

where M is the magnification of the reticle, $\lambda$ is the exposure wavelength, NA is the numerical aperture on the wafer side of the projection optical system, and $\sigma$ is the coherence factor of the illumination optical system.

In the case of a checkered pattern, the reticle includes a periodic pattern where a transmitting area and a shading area are repeated in the pitch expressed as:

$$2^{1/2} M\lambda/\{(1+\sigma) \times NA\} < p < 2^{1/2} M\lambda/\{(1-\sigma) \times NA\}$$

where M is the magnification of the reticle, $\lambda$ is the exposure wavelength, NA is the numerical aperture on the wafer side of the projection optical system, and $\sigma$ is the coherence factor of the illumination optical system.

The defocus is preferably realized by moving at least either the position of the reticle or that of the wafer from a focus position or by placing the periodic pattern of the reticle on the back of the reticle.

Furthermore, the shading area of the reticle are made of a translucent material and the phase difference between the light passing through the transmitting area and the light passing through the translucent material is set at 180°.

The pattern width of the shading area of the reticle is preferably set greater than the pattern width of the transmitting area.

In the method of examining an exposure tool according to the invention, the reticle including a periodic pattern where a transmitting area and a shading area are repeated in a finite number and the wafer are defocused. Exposing the periodic pattern enables not only the $0^{th}$-order diffracted light but also the diffracted light of the first order or higher to be generated.

Since the diffracted light of the first order or higher is projected on the edge of the pupil of the projection optical system, the shape of the light source is observed using the $0^{th}$-order diffracted light and the shape of the pupil is observed using the diffracted light of the first order or higher. Moreover, both of the shape of the light source and that of the pupil can be measured easily in one exposure in the same state as in normal exposure, without disassembling the exposure tool. Consequently, there is no need to measure the shape of the light source and that of the pupil for each of two types of reticle as in a conventional method using double exposure.

Furthermore, since the shape of the light source and that of the pupil are drawn in such a manner that they are laid on a photoresist by single exposure, not using double exposure, no overlay error occurs in exposing them. As a result, they are measured with high accuracy.

Additionally, since the diffracted light of the first order or higher is generated with a periodic pattern differently from a conventional method of forming a pattern using isolated points, the light intensity making the edge of the pupil conspicuous is high and the exposure time is short. Because a high-contrast image is obtained, image processing is not necessary. Therefore, no special device configuration for measurement is needed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A shows an overall configuration of an exposure tool according to a first embodiment of the present invention when a reticle is provided in the focus position;

FIG. 3B shows an overall configuration of the exposure tool according to the first embodiment when a reticle is provided in the defocus position;

FIG. 4 shows an overall structure of a reticle used in a method of examining the exposure tool according to the first embodiment;

FIG. 5A is a plan view of a pattern transferred from the reticle in the first embodiment;

FIG. 5B is a schematic representation of the shape of the pattern transferred from the reticle in the first embodiment;

FIG. 6A is an illustration to help explain the reason why the pitch of a diffraction pattern in the first embodiment is limited;

FIG. 6B is an illustration to help explain the reason why the pitch of a diffraction pattern in the first embodiment is limited;

FIG. 6C is an illustration to help explain the reason why the pitch of a diffraction pattern in the first embodiment is limited;

DETAILED DESCRIPTION OF THE INVENTION

Figures 1A, 1B:
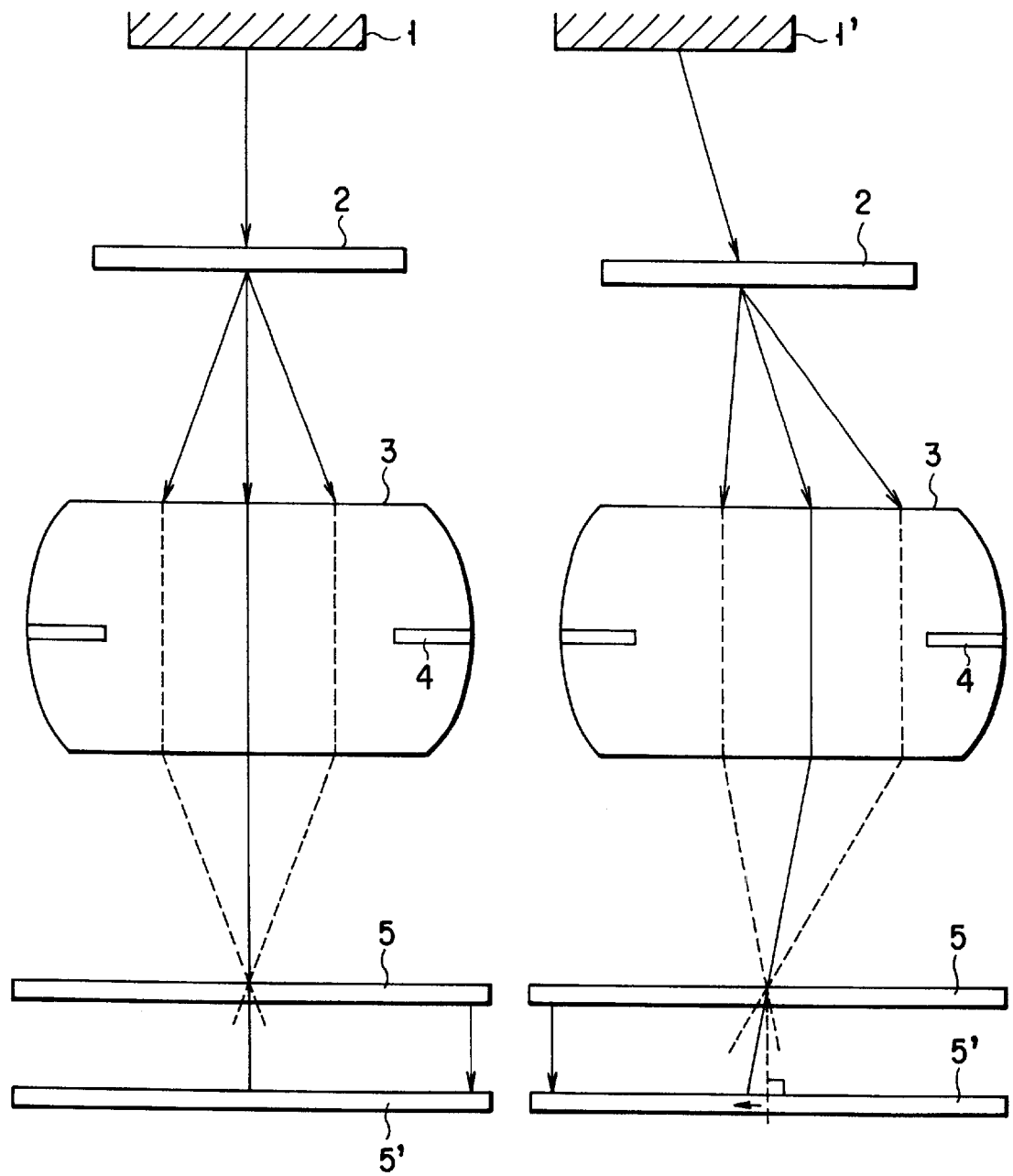
FIG. 1A shows the defocused state of a conventional exposure tool.
FIG. 1B is a schematic representation to help explain the change of the position of a pattern due to defocusing in the conventional exposure tool.
Figure 2A:
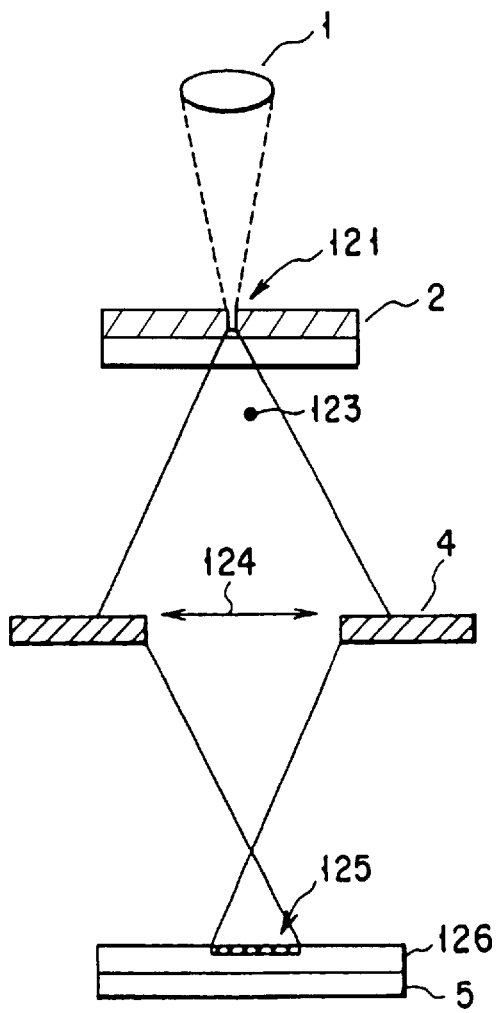
FIG. 2A is a schematic representation to help explain a first step in a conventional method of examining an exposure tool.
Figure 2B:
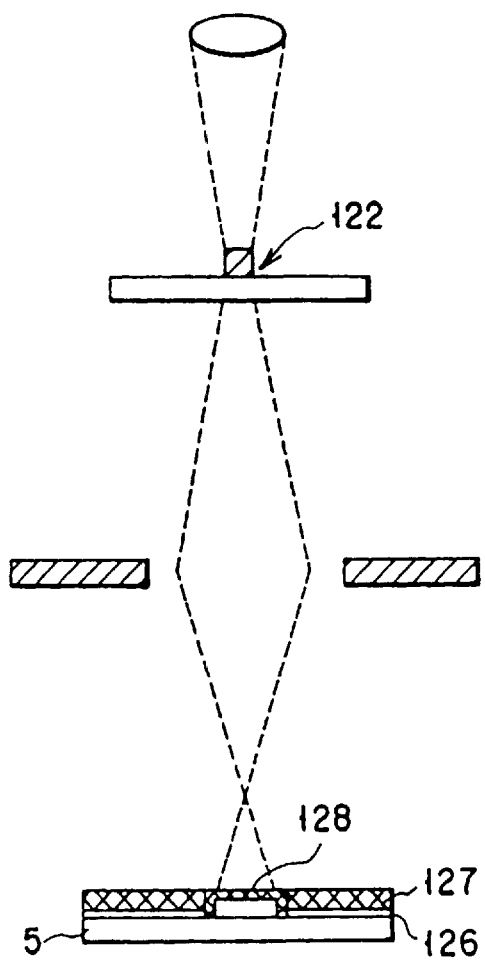
FIG. 2B is a schematic representation to help explain a second step in the conventional method of examining an exposure tool.
Figure 2C:
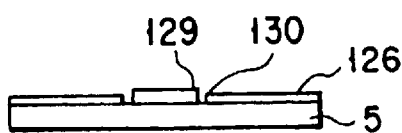
FIG. 2C shows a pattern transferred by the conventional method of examining an exposure tool.

Hereinafter, referring to the accompanying drawings, embodiments of the present invention will be explained.

(First Embodiment)

FIG. 3A to FIG. 4 are illustrations to help explain a method of examining an exposure tool according to a first embodiment of the present invention. In the first embodiment, examination is made using an ArF excimer laser exposure tool (with λ: 193 nm, NA: 0.55, σ: 0.6, and M: 20).

FIGS. 3A and 3B show the configuration of an exposure tool used in examination related to the first embodiment. As shown in FIG. 3A, the exposure tool comprises an illumination optical system 1 that directs the light emitted from a light source to a reticle 2, and a projection optical system 3 that transfers the reduced projection image at the reticle 2 onto a wafer 5. FIG. 3A shows a case where the reticle 2 is placed in the focus position. FIG. 3B shows a case where the reticle 2 is defocused toward the light source.

FIG. 4 is a plan view of a concrete pattern of the patterned area 2' on the reticle 2 used in examination. The patterned area 2' is composed of a shading area 21 and transmitting areas 22. A diffraction pattern is formed by drawing a grating pattern of square transmitting areas 22 with each side 200 μm long surrounded by the shading area 21 on the reticle 2. The pitch of the diffraction pattern is set at 5.5 μm and the ratio of the pattern width of the shading area to that of the transmitting area is set at 3:2.

The pattern in the reticle 2 is put in the position 5 cm closer to the light source than the position of the normal reticle 2 surface conjugate with the wafer 5 in the projection optical system 3. With the pattern in the position, exposure is made in the defocused state. The dosage of exposure is set at 20 times that in normal exposure. A positive photoresist is used as photosensitive material. The wafer 5 coated with photoresist is placed in the position where normal pattern exposure is to be made. After exposure, development is made to produce a resist pattern.

FIG. 5A is a plan view of a resist pattern 31 formed as described above. FIG. 5B is a schematic representation of the shape of the resist pattern 31. Eighty units of the resist pattern 31 shown in FIG. 5 are prepared at such intervals as prevent images from overlapping with each other, in a simultaneous exposure square area with sides 3 mm long on the wafer 5. The resist patterns are observed under an ordinary optical microscope. In the central portion 32 on which the $0^{th}$-order diffracted light was projected, all the resist has disappeared. The contour 33 of the central portion 32 represents the shape of the image expressing the size σ of the light source (hereinafter, referred to as the shape of the light source).

A peripheral portion 34 formed around the central portion 32 is an area on which the first-order diffracted light was projected. In this area, only the surface of the photoresist has removed and the photoresist has become thinner. The shaded portion of the area outside the peripheral portion 34 is a portion where the photoresist is left. The circle tracing the outer edge of the peripheral portion 34 represents the shape of the pupil of the projection optical system (hereinafter, referred to as the pupil). In this case, there is no difference between the center of the light source 36 (the center of the round image representing the size σ of the light source) and the center 37 of the pupil (the center of the round image representing the size NA of the pupil).

The principle of examining the shape of the light source, the shape of the pupil, and the alignment of the light source with the pupil will be explained below.

When there is no periodic diffraction pattern in the isolated hole patterns, the result is the same as that with the prior-art pinhole camera. Specifically, the image transferred onto the wafer is only the image of the light source (the light-intensity distribution at the outlet of the light source). The resolution of the pinhole camera is determined by the size of the pinhole. Thus, if the size of the pinhole is made small in the range where diffraction is inconspicuous, the shape of the light source can be projected more faithfully. On the other hand, the dosage of exposure necessary for projection increases. If the hole is formed into a square with each side 50 to 500 μm long or a circle with a diameter 50 to 500 μm, the dosage of exposure about 10 to 20 times that used in normal exposure is sufficient. That dosage is feasible.

To measure the shape and position of the pupil, a periodic grating pattern is placed in the isolated transmitting area. When the shading area has been replaced with the transmitting area, a periodic grading pattern is placed in the isolated shading area. If the period is sufficiently small, the pattern causes the diffraction of light, which generates the $0^{th}$-order diffracted light 7 and the first-order diffracted light 8. The $0^{th}$-order diffracted light 7 is a diffracted-light component going straight on even after passing the grating pattern and has the highest intensity.

The first-order diffracted light 8 propagates in the direction in which it goes away from the optical axis and illuminates the vicinity of the edge of the pupil 4 of the projection optical system 3. Of the first-order diffracted light, the light 9 arrived at the inside of the pupil 4, or the NA, reaches the wafer 5, whereas the first-order diffracted light 8 arrived at the outside of the pupil 4 is shaded and fails to reach the wafer 5. That is, the light passed through the pupil forms a pattern on the wafer 5, with the result that the boundary between the pattern-forming area and the pattern-unforming area represents the shape of the edge of the pupil. From the boundary of the first-order diffracted light 8, the shape and position of the pupil are determined.

Since each diffracted light is an image of the light source, the center and position of the light source can be determined from the $0^{th}$-order diffracted light 7. Specifically, the shape and size of each of the effective pupil and the light source and their relative positions at an arbitrary point in the simultaneous exposure area can be determined from the image transferred to the wafer 5 as a resist pattern.

Moreover, the difference between the axis of the illumination optical system 1 and that of the projection optical system 3 in the exposure tool is determined by measuring the positional difference. To make it possible to measure the shape and size of each of the pupil and light source, the pattern on the reticle 2 is so drawn on the wafer 5 that its pattern image has a sufficiently large size and is defocused on the wafer 5. Specifically, the reticle 2 put in the focus position of FIG. 3A is defocused upward as shown in FIG. 3B. In this state, exposure is made. In defocusing, the wafer 5 may be moved instead of the reticle. Alternatively, both of the reticle 2 and wafer 5 may be moved.

The reason why the pitch of diffraction patterns is limited will be explained by reference to FIGS. 6A to 6C. FIGS. 6A to 6C show the positions in which a diffraction pattern is transferred onto the wafer. When the size 41 of the pupil 4 of the projection optical system 3 is expressed by the amount normalized using NA as shown in FIG. 6A, each diffracted light is in the same shape as that of the light source. The radius 42 of the diffracted light is expressed by σ. Taking into account the diffraction caused by a periodic diffraction pattern with a pitch of p, the distance 43 between diffracted rays of light is expressed by λ/(p×NA).

To project the shape and position of the pupil onto the wafer 5, the first-order diffraction pattern 44 on which the first-order diffracted light 8 is projected has to cross the edge 35 of the pupil. Specifically, when the first-order diffracted light 8 is completely in the pupil as shown in FIG. 6B or when the first-order diffracted light 8 is completely out of the pupil as shown in FIG. 6C, the position of the pupil cannot be observed. The condition for the image of the pupil to be formed on the wafer 5 is that the pitch p of the diffraction pattern on the reticle 2 fulfills the following expression:

$$Mλ/\{(1+σ)×NA\} < p < Mλ/\{(1-σ)×NA\}$$

where M is the magnification of the reticle 2 and λ is the exposure wavelength.

The left-side term expresses the condition for none of the first-order diffracted light 8 to go out of the edge 35 of the pupil. The right-side term expresses the condition for all the first-order light 8 not to fit completely in the edge 35 of the pupil.

(Second Embodiment)

Figure 7:
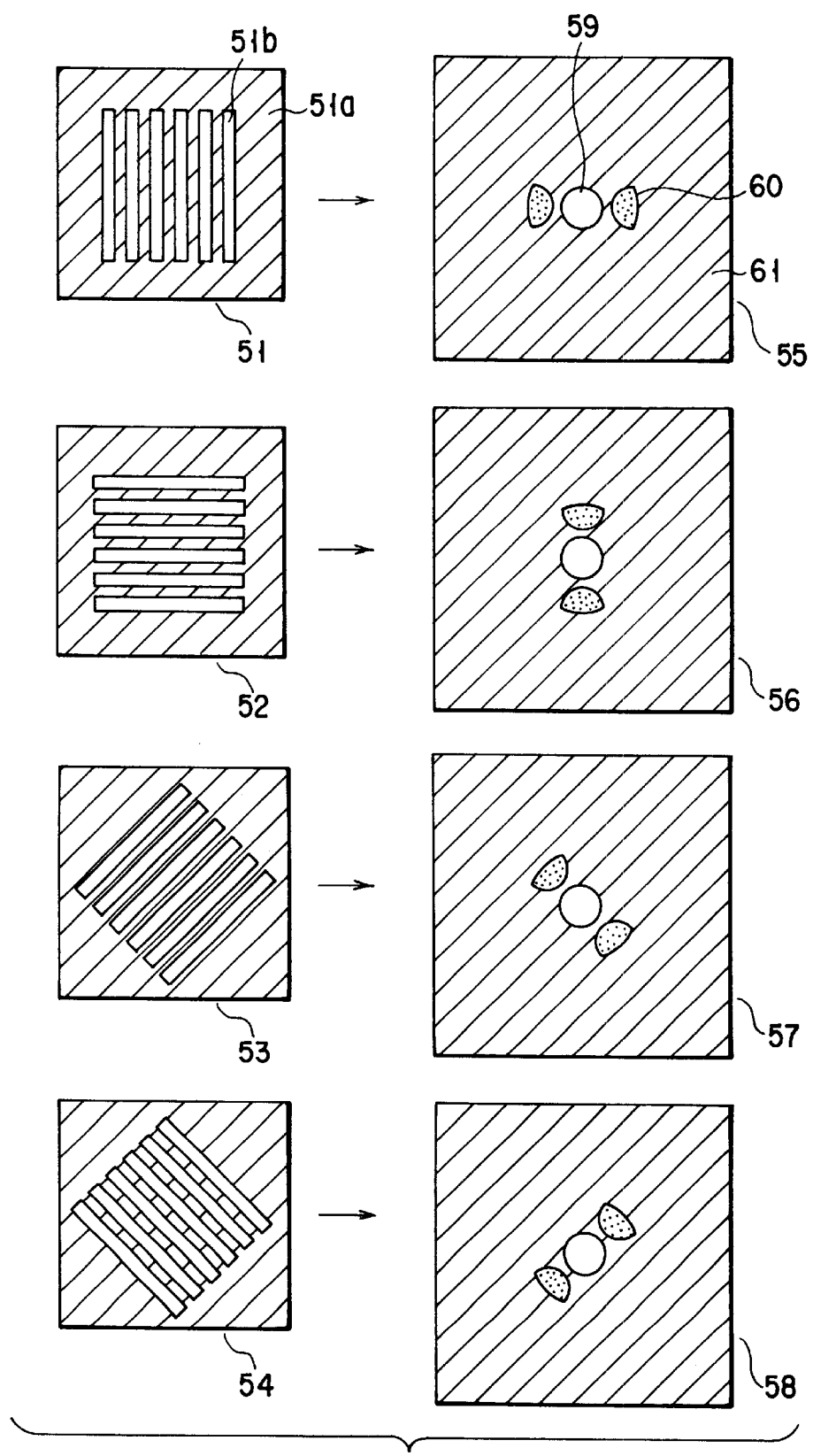
FIG. 7 shows an overall structure of a reticle used in a method of examining an exposure tool according to a second embodiment of the present invention.
Figure 8A:
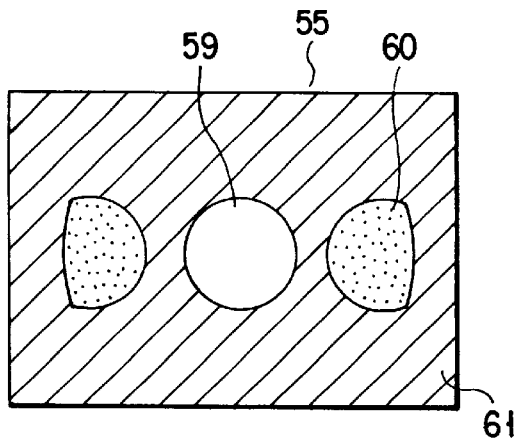
FIG. 8A is a representation to help explain the image processing of only one resist pattern in the second embodiment.
Figure 8B:
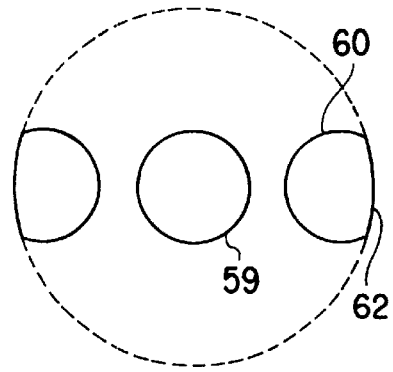
FIG. 8B is a representation to help explain the image processing of only one resist pattern in the second embodiment.
Figure 8C:
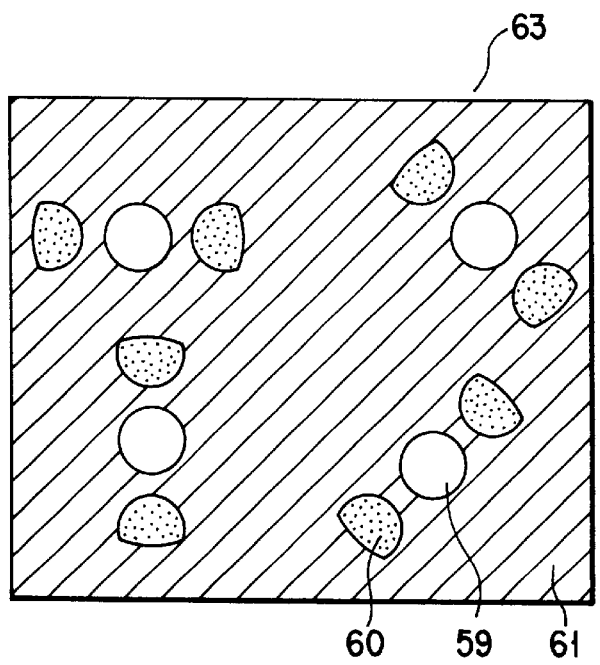
FIG. 8C is a representation to help explain the image processing of four resist patterns in the second embodiment.
Figure 8D:
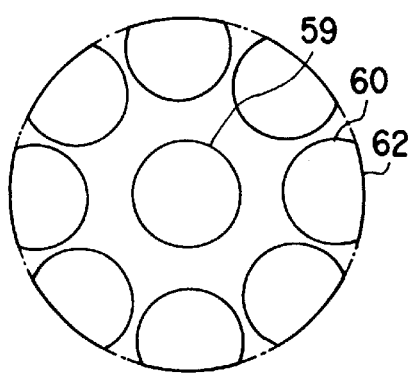
FIG. 8D is a representation to help explain the image processing of four resist patterns in the second embodiment.
Figure 8E:
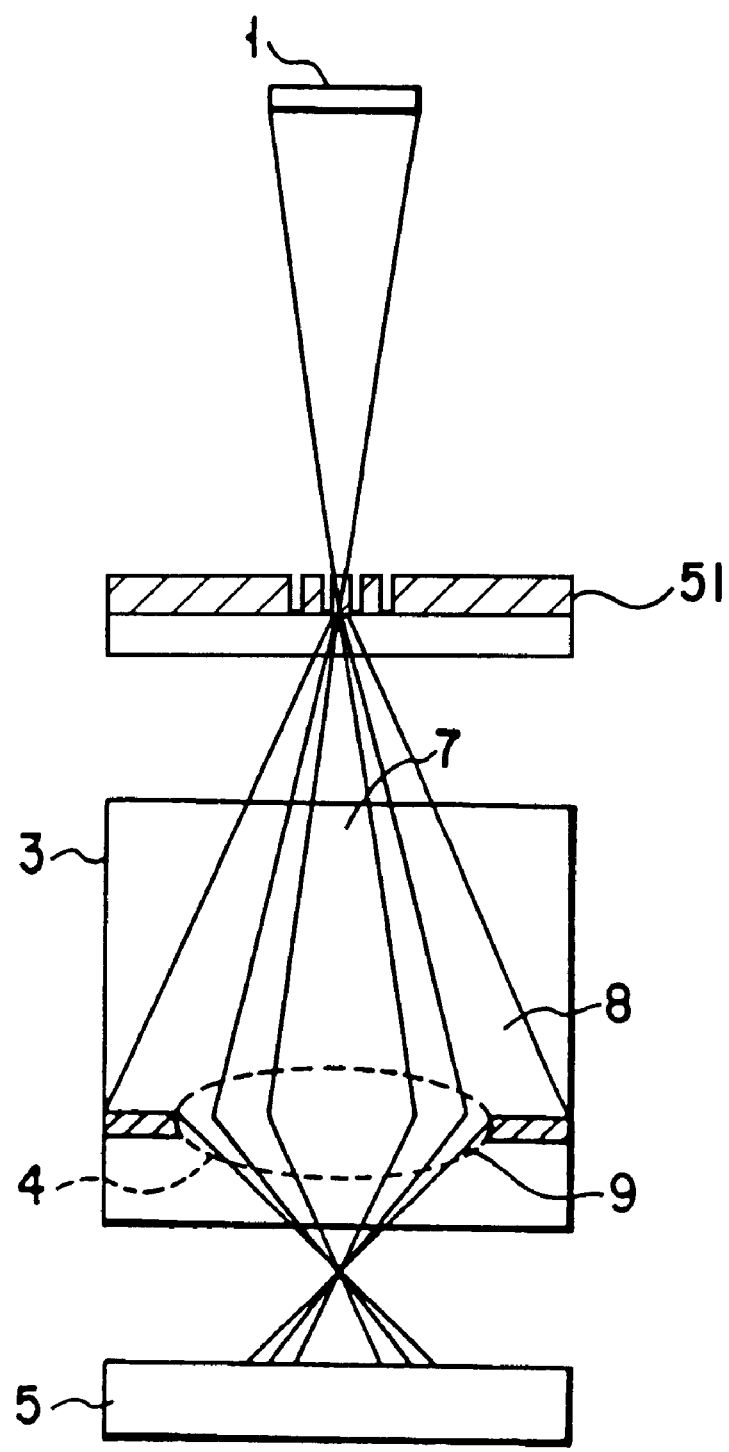
FIG. 8E is an illustration showing an embodiment wherein examination is carried out, with a reticle turned in an opposite direction to a reticle for use in an ordinary pattern exposure.

FIG. 7 to FIG. 8D are illustrations to help explain a method of examining an exposure tool according to a second embodiment of the present invention. In the second embodiment, the pattern of the reticle 2 used in the examining method of the first embodiment is applied to a line & space pattern. Additionally, in the second embodiment, examination is made using a KrF excimer laser exposure tool (with λ: 0.248 nm, NA: 0.6, σ: 0.3, and M: 4). What is the same as in the first embodiment will not be explained.

A line & space pattern with the shading area-to-the transmitting area ratio of 1:1 is formed on a reticle by providing line-shaped transmitting areas 51b to 54b in square areas 51 to 54 with each side 80 μm long in the shading areas 51a to 54a, respectively. The pattern is drawn on the back of the reticles. Four pitches of the line & space pattern are used. They are 1.6 μm, 1.8 μm, 2.0 μm, and 2.2 μm. Moreover, after the direction of the line & space pattern is changed, four types of the pattern are formed for each of areas 51 to 54 on the reticles. These 16 types of patterns obtained by changing the pattern pitch and the direction of pattern are arranged at intervals of at least 5 mm in the simultaneous exposure area in such a manner that images do not overlap with each other. Then, referring to FIG. 8E the surface on which the shading portions of the areas 51 to 54 on the reticles including the 16 patterns are provided is put on the surface opposite to the surface on which the shading area of the reticle used in normal pattern exposure is provided. Then, it is exposed. In this way, by placing the reticles with their upside down to those in normal pattern exposure, the reticles can be exposed easily in the same positions as in normal pattern exposure in the defocused state without moving the reticles and wafer 5. Exposure is made with the dosage of exposure 20 times that in normal pattern exposure.

Exposure using the reticles causes the $0^{th}$-order diffracted light image and first-order diffracted light image to be transferred to the photoresist coated on the wafer 5, which produces resist patterns 55 to 58. In the $0^{th}$-order diffraction area 59 on which the $0^{th}$-order diffracted light has been projected, the photoresist has completely disappeared. In the first-order diffraction area 60 on which the first-order diffracted light has been projected, only the surface of the photoresist has removed, with the result that the photoresist has become thinner. The shaded area is the resist remaining area 61 where the photoresist remains because no light has been projected.

In the resist patterns obtained by using the reticles with the four pitches, as the pitch of the diffraction pattern becomes shorter, the first-order diffraction area 60 moves in the direction in which it goes away from the $0^{th}$-order diffraction area 59. Then, a line & space pattern with the most suitable one of the four periods to widely observe the shape of the pupil is determined and supplied to a computer in the form of image data.

FIGS. 8A and 8B show the image processing of only the resist pattern 55 shown in FIG. 7. FIGS. 8C and 8D show the image processing of the resist patterns 55 to 58. FIGS. 8B and 8D show the image data after the image analysis has been done on the basis of the resist patterns 55 and 63.

The $0^{th}$-order diffraction area 59 represents the shape of the light source. The area where the first-order diffraction area 60 is cut away at the outermost part of the obtained image represents part of the contour 62 of the pupil shown in FIGS. 8B and 8D. It is assumed that the optical system does not change greatly in adjacent places in the simultaneous exposure area. On this assumption, the diffracted images in the four directions of the line and space patterns adjacent to each other in FIG. 8C are combined on the image data as shown in FIG. 8D.

The reason why the image data items are combined as described above is as follows. The direction in which diffracted light is generated differs depending on the direction of the periodic pattern. With the grating pattern of the first embodiment, the first-order diffracted light is generated in four directions. In the case of the line & space pattern of the second embodiment, however, the first-order diffracted light is generated only in two directions. Use of only one periodic pattern enables the shape of the pupil to be measured partially. Thus, by combining diffracted images obtained from exposure with periodic patterns in plural directions, almost all the contour 62 of the pupil is obtained. In this way, the shape of the pupil and the alignment of the light source with the pupil can be measured with high accuracy by combining the diffracted images obtained in the individual directions. From the comparison between the position of the light source and that of the pupil, the deviation of the axis of the optical system in each position in the exposure area is determined.

Use of a periodic pattern rotated in an arbitrary direction other than the direction of the periodic patterns shown in the second embodiment produces a similar effect.

As described above, with the second embodiment, the first-order diffracted light is generated in two directions with the line & space pattern, whereas it is generated in four directions with the grating pattern of the first embodiment. In this case, the shape of the pupil is measured only partially, but the first-order diffracted light concentrates in a narrow area without dispersing. Because the light intensity that makes the shape of the pupil stand out in relief is improved, the position of the pupil can be measured even at the dosage of exposure smaller than when the grading pattern is used.

(Third Embodiment)

Figure 9:
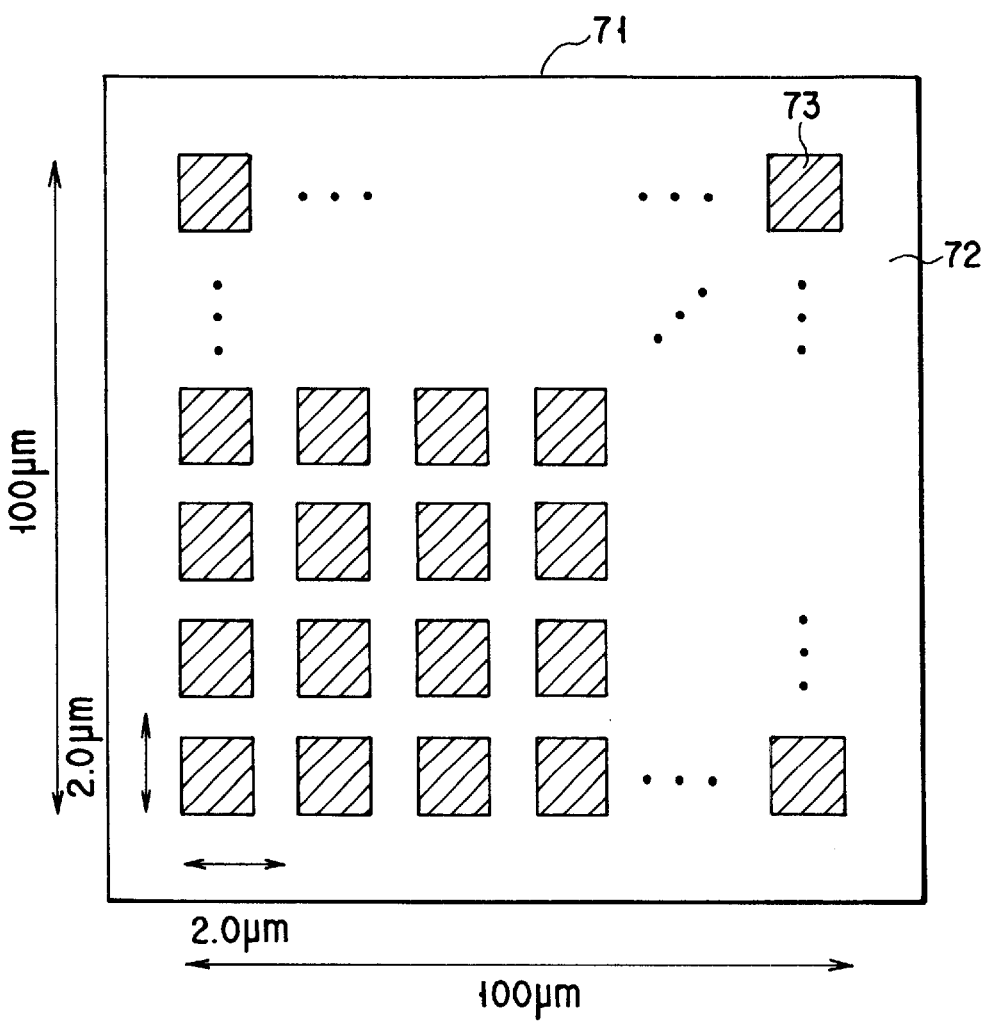
FIG. 9 shows an overall structure of a reticle used in a method of examining an exposure tool according to a third embodiment of the present invention.
Figure 10:
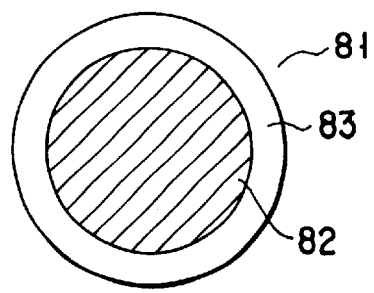
FIG. 10 is a plan view of a pattern transferred from the reticle in the third embodiment.

FIGS. 9 and 10 are illustrations to help explain a method of examining an exposure tool according to a third embodiment of the present invention. In the third embodiment, examination is made using an exposure tool with KrF excimer laser as a light source (with NA: 0.6, σ: 0.75, and M: 4).

In the third embodiment, a diffraction grating pattern where the ratio of the width of a transmitting area 72 to a shading area 73 is 1:2 is provided on the back of a square area 71 with each side 100 μm long on a reticle as shown in FIG. 9. The peripheral area of the area 71 is the transmitting area 72. The reason why the pattern width ratio of the transmitting area 72 to the shading area 73 is set as described above in the diffraction pattern is as follows.

The intensity ratio of the $0^{th}$-order diffracted light to the first-order diffracted light can be adjusted by changing the pattern width ratio of the shading area to the transmitting area on the diffraction pattern. It is known that the intensity of the first-order diffracted light is expressed by $$\left\{\frac{\sin(\pi x)}{\pi x}\right\}^2,$$

where p is the period of the diffraction pattern, q is the width of the transmitting area, and the intensity of the $0^{th}$-order diffracted light $$x = \frac{q}{p},$$

is 1. From this expression, it is understood that when the transmitting area: the shading area=1:1, the first-order diffracted light is about 40% of the $0^{th}$-order diffracted light. It is also understood that as the proportion of the shading area is increased, the relative intensity of the first-order diffracted light becomes higher accordingly.

Therefore, by setting the pattern width of the shading area greater than that of the transmitting area as in the third embodiment, the difference in light intensity between the $0^{th}$-order diffracted light and the first-order diffracted light is decreased, which makes the contour of the pupil clearer. Namely, the ratio of the transmitting area to the shading area can be optimized.

The area 71 is such that the transmitting area is replaced with the shading area on the area on the reticle 2 in the first embodiment and transmitting area isolated points are provided in the whole shading area. The pitch of the diffraction pattern is assumed to be 2.0 μm. Plural units of the area 71 are provided at intervals of at least 5 mm in the simultaneous exposure area.

The amount of exposure is determined as follows. First, exposure is made at various dosage of exposure by using a reticle whose whole surface is a transmitting area. In this case, since there is no diffraction pattern, all of the simultaneous exposure area is exposed. As the dosage of exposure is decreased below the usual value, the threshold value of the amount of exposure at which all the resist is removed appears. Most of the diffraction pattern in the third embodiment is a transmitting area, with a little shading area. Therefore, when the amount of exposure is set at a value much greater than the threshold value, light higher than the threshold value exposes the area corresponding to the shade of the pattern, which prevents a pattern from being formed. Then, when the amount of exposure is set near the threshold value and exposure is made, a diffraction pattern to be measured is formed on the wafer.

After the exposure has been made at the dosage of exposure determined as described above, development is made. The obtained resist pattern is shown in FIG. 10. The resist pattern is such that the photosensitive area is replaced with the non-photosensitive area in the resist pattern of the first embodiment. In the areas of NA and σ where light intensity is low, the resist is left on the wafer. The resist pattern 81 is measured under an optical microscope. The central area 82 represents the shape of the light source. The peripheral area 83 around the central portion, which is an area where the resist has become thinner, represents the shape of the pupil. From the shape of the light source and that of the pupil obtained from the contours of the central area 32 and peripheral area 83, the deviation of the axis of the light source from that of the pupil is measured.

With the third embodiment, the optimization of the pattern width ratio of the shading area to the transmitting area makes it possible to adjust the intensity ratio of the $0^{th}$-order diffracted light to the first-order diffracted light optimally. This decreases the blur of the contour of the pupil caused in the 1:1 pattern-width ratio and enables examination with higher accuracy.

(Fourth Embodiment)

Figure 11:
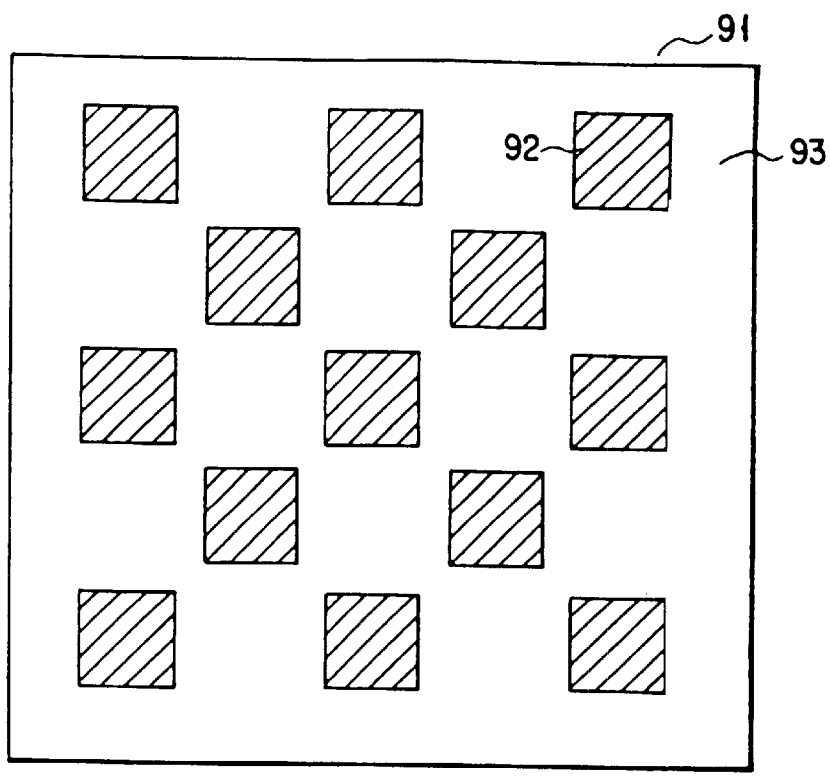
FIG. 11 shows an overall structure of a reticle used in a method of examining an exposure tool according to a fourth embodiment of the present invention.
Figures 12A, 12B:
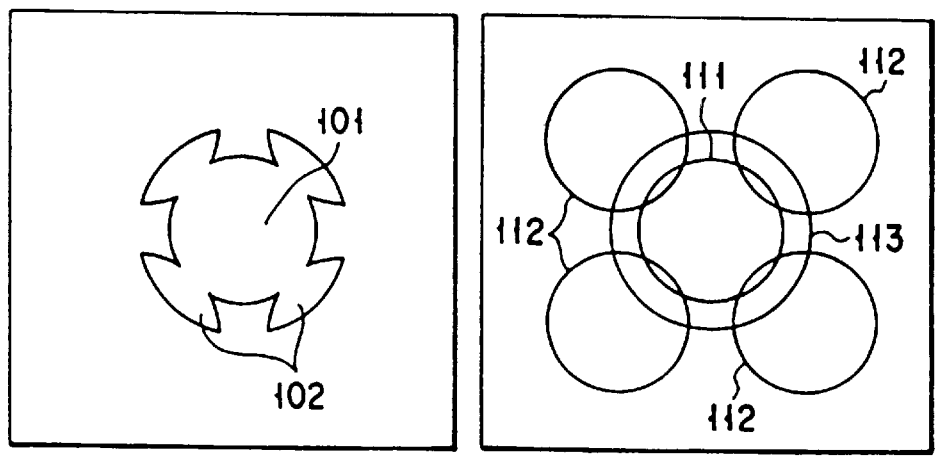
FIG. 12A is a plan view of a pattern transferred from the reticle in the fourth embodiment.
FIG. 12B is a plan view of a pattern transferred from the reticle in the fourth embodiment.

FIG. 11 to FIG. 12B are illustrations to help explain a method of examining an exposure tool according to a fourth embodiment of the present invention. In the fourth embodiment, an attenuated phase shifting mask is used as a reticle used in examination. Additionally, in the fourth embodiment, examination is made using an exposure tool using a KrF excimer laser (with a wavelength of 248 nm) as a light source (with NA: 0.6, σ: 0.75, and M: 4).

FIG. 11 is a plan view of a patterned area 91 on a reticle used in an examining method according to the fourth embodiment. As shown in FIG. 11, a translucent material with an intensity transmittance of 6% and a 180° phase difference between the transmitting area and the shading area is used as a shading film constituting a shading area 92. On the reticle, a square transmitting area with each side 100 μm long is formed, with a translucent area in its periphery. In the transmitting area, a checkered translucent diffraction pattern, where shading areas 92 and transmitting areas 93 are arranged alternately, is drawn as shown in FIG. 11. It is assumed that the pitch of the diffraction pattern is 1.8 μm and the ratio of the width of the shading area 92 to that of the transmitting area 93 is 7:11.

The reticle containing the patterned area 91 is installed on the exposure tool of FIG. 3A, with upside down to those in normal pattern exposure. The wafer 5 coated with a photoresist is placed in the position used in normal pattern exposure and exposure is made. The amount of exposure is set at about 20 times that in normal pattern exposure. A positive photoresist is used as a photosensitive material. After the exposure, development is made to produce a resist pattern to be measured.

FIG. 12A is a plan view of the obtained resist pattern. As shown in FIG. 12A, 33 resist patterns are prepared at such intervals as prevent images from overlapping each other in a simultaneous exposure area of rectangle with sides 8 mm and 25 mm long on a wafer. They can be measured under an ordinary optical microscope. The shaded area is an area where the photoresist has not been exposed and remained. The shape of a second-order light source appears as the central portion 101 and four peripheral portions 102 formed adjacent to the central portion.

FIG. 12B is a representation to help explain the structure of the resist pattern shown in FIG. 12A. The pattern of FIG. 12A is composed of six circles shown in FIG. 12B. A circle 111 made up of the outer edge of the central portion 101 represents the position and shape of the $0^{th}$-order diffracted light. The outer edge of the peripheral portion represents the first-order diffraction pattern formed by the first-order diffracted light and the edge 113 of the pupil.

The result of the fourth embodiment using the attenuated phase shifting reticle differs from those of the first to third embodiments. In the fourth embodiment, the intensity of the $0^{th}$-order diffracted light is almost equal to that of the first-order diffracted light. As a result, the image of the $0^{th}$-order diffracted light does not collapse, which allows the structure of each of the $0^{th}$-order diffracted light and the first-order diffracted light to be seen clearly. Namely, variations in the light intensity inside the light source and the deviation of the pupil from the light source can be measured in only one exposure.

Next, a method of deriving the pattern ratio of the transmitting area to the shading area that optimizes the intensity ratio of the $0^{th}$-order diffracted light to the first-order diffracted light will be explained. While in the fourth embodiment, a checkered pattern has been used as a reticle, a translucent line & space pattern whose intensity transmittance and phase difference are the same as in the third embodiment is used. Let the pitch of the line & space pattern be p, the width of the transmitting area be q. If the intensity transmittance of the translucent area is 6%, and phase difference between the translucent area and the transmitting area is 180°, the ratio of the intensity of $0^{th}$-order diffracted light $I_0$ and that of first-order $I_1$ is expressed by the following expression:

$$\frac{I_1}{I_0} = \left[\frac{0.396 \sin(\pi x)}{1.245x - 0.245}\right]^2$$

where x=q/p.

In the equation, where x=0.515, the ratio is almost equal 1, which allows the light source and the pupil to be measured at the same intensity. Similarly, with a grating pattern or a checkered pattern, the intensity of the $0^{th}$-order diffracted light may be almost equal to that of the first-order diffracted light, which enables a diffraction pattern in the ratio of the transmitting area to the shading area to be used.

When the fourth embodiment is applied to a checkered pattern, the conditions for the pitch changes slightly because the position of the first-order diffracted light is as shown in FIG. 12. In this case, the condition for an image of the pupil to be formed on the wafer is expressed by the following expression:

$$2^{1/2}M\lambda/\{(1+\sigma) \times NA\} < p < 2^{1/2}M\lambda/\{(1-\sigma) \times NA\}$$

Figure 13:
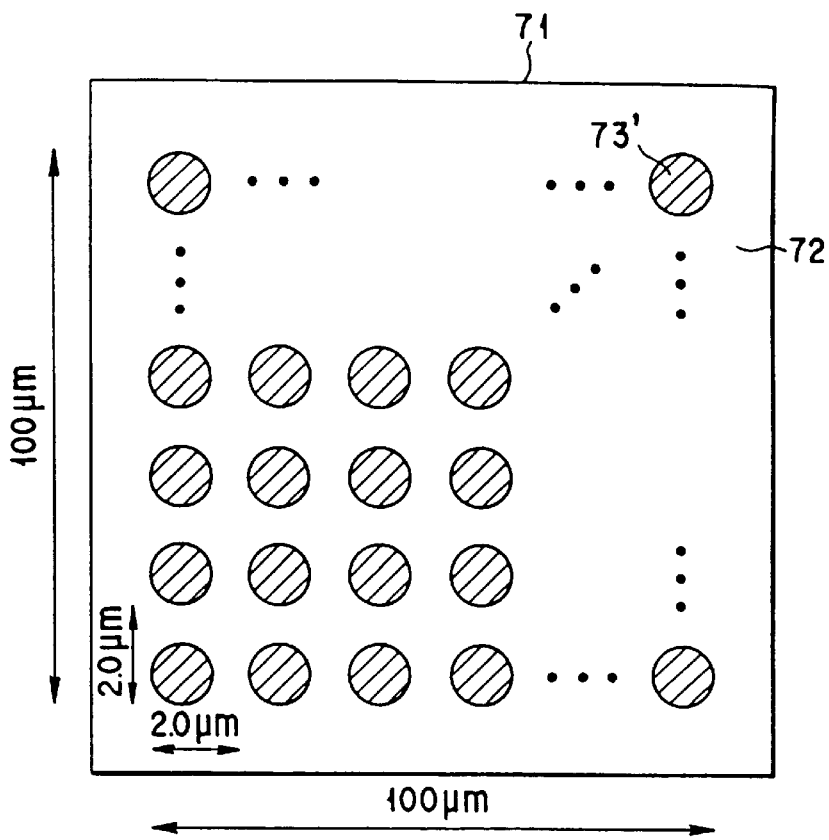
FIG. 13 is a plan view of a pattern transferred from the reticle in a modification of the fourth embodiment.
Figure 14:
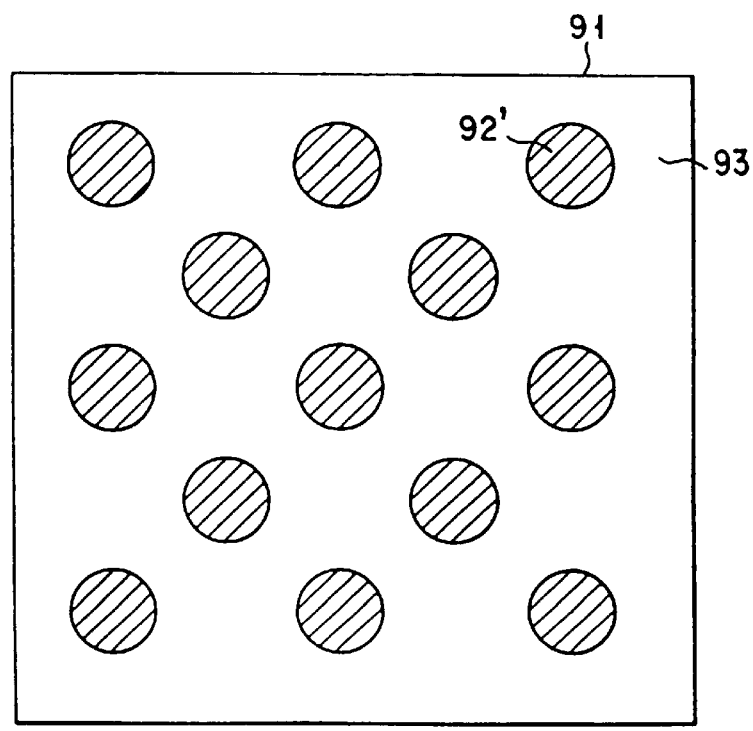
FIG. 14 is a plan view of a pattern transferred from the reticle in a modification of the fourth embodiment.

The present invention is not limited to the above embodiments. In addition to a grading pattern, a line & space pattern, a checkered pattern, and a pillar pattern, any pattern, such as a round pattern or a contact hole pattern may be used as the periodic pattern, provided that the transmitting area and the shading area are arranged at intervals in the pattern and the diffracted light is generated. Modifications of the periodic pattern are shown in FIGS. 13 and 14. FIG. 13 shows a modification of the periodic pattern of FIG. 9, where the square grating shading area 73 of FIG. 9 is replaced with a round shading area 73'. FIG. 14 shows a modification of the periodic pattern of FIG. 11, where the square grating shading area 92 of FIG. 10 is replaced with a shading area 92'.

As described above, in the method of examining an exposure tool according to the present invention, the diffracted light of the first order or higher passed through the reticle including the periodic pattern where a transmitting area and a shading area are repeated in a finite number illuminates the outer edge of the pupil of the projection optical system. This transfers the image of the outer edge of the pupil onto the wafer. Then, the pattern image to be transferred onto the wafer is defocused and exposed. As a result, the shape of the light source is observed using the $0^{th}$-order diffracted light and the shape of the pupil is observed using the diffracted light of the first order or higher. Furthermore, both the shape of the light source and that of the pupil can be measured easily in one exposure in the same state as in normal exposure, without disassembling the exposure tool.

Because the shape of the pupil and that of the light source are drawn in such a manner that they are laid on the photoresist by single exposure, not using double exposure, no overlay error occurs in exposing them.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of examining an exposure tool, comprising:

the step of causing an illumination optical system to direct light emitted from a light source to a reticle on which a pattern is formed, said reticle including a periodic pattern where a transmitting area and a shading area are repeated in a finite number;

the step of projecting the diffracted light of the first order or higher passed through said reticle onto the outer edge of the pupil of a projection optical system and forming a shape of the light source and an outline of the pupil of the projection optical system on a wafer in a defocus state; and the step of examining the shape of said light source, the shape of the pupil of said projection optical system, and the alignment of the shape of said light source with the shape of the pupil on the basis of the pattern image transferred onto said wafer.

2. A method of examining an exposure tool according to claim 1, wherein said reticle includes a periodic pattern where a transmitting area and a shading area are repeated in the pitch expressed by the following expression:

$$M\lambda/\{(1+\sigma)\times NA\} < p < M\lambda/\{(1-\sigma)\times NA\}$$

where M is the magnification of said reticle, $\lambda$ is the exposure wavelength, NA is the numerical aperture on the wafer side of said projection optical system, and $\sigma$ is the coherence factor of said illumination optical system.

3. A method of examining an exposure tool according to claim 1, wherein said defocus is realized by moving at least either the position of said reticle or that of said wafer from a focus position.

4. A method of examining an exposure tool according to claim 1, wherein said defocus is realized by placing the shading area of said reticle on the opposite surface to the surface on which the shading area of said reticle used in pattern exposure are placed.

5. A method of examining an exposure tool according to claim 1, wherein the shading area of said reticle is made of a translucent material and the phase difference between the light passing through said transmitting area and the light passing through said translucent material is set at 180°.

6. A method of examining an exposure tool according to claim 1, wherein the pattern width of said shading area of said periodic pattern is set greater than the pattern width of said transmitting area.

7. A method of examining an exposure tool according to claim 5, wherein the pattern width of said shading area of said periodic pattern is set smaller than the pattern width of said transmitting area.

8. A method of examining an exposure tool according to claim 1, wherein said periodic pattern is formed all over the inside of the area of a circle with a diameter of 50 to 500 $\mu$m.

9. A method of examining an exposure tool according to claim 1, wherein said periodic pattern is formed all over the inside of the area of a square or a rectangle each side in the range of 50 to 500 $\mu$m.

10. A method of examining an exposure tool according to claim 1, wherein said periodic pattern is formed all over the inside of the area of a circle with a diameter of 50 to 500 $\mu$m and the periphery of the area is a shading area.

11. A method of examining an exposure tool according to claim 1, wherein said periodic pattern is formed all over the inside of the area of a square or a rectangle each side in the range of 50 to 500 $\mu$m and the periphery of the area is a shading area.

12. A method of examining an exposure tool according to claim 1, wherein said periodic pattern is a line & space pattern.

13. A method of examining an exposure tool according to claim 1, wherein said periodic pattern includes a plurality of line & space patterns differing in direction.

14. A method of examining an exposure tool according to claim 1, wherein said periodic pattern is a square grating pattern.

15. A method of examining an exposure tool according to claim 1, wherein said periodic pattern is a checkered pattern.

16. A method of examining an exposure tool according to claim 1, wherein said periodic pattern has periodic square grating or checkered transmitting area, each transmitting area being round.

17. A method of examining an exposure tool according to claim 1, wherein said periodic pattern has periodic square grating or checkered shading area, each shading area being round.

* * * * *